United States Patent
McDonald (12)

(10) Patent No.: US 6,168,663 B1
(45) Date of Patent: *Jan. 2, 2001

(54) THIN SHEET HANDLING SYSTEM CROSS-REFERENCE TO RELATED APPLICATIONS

(75) Inventor: Eamon P. McDonald, 24046 Fuschia Ct., Murrieta, CA (US) 92562

(73) Assignees: Eamon P. McDonald, Murrieta; Seamus P. McDonald, Temecula, both of CA (US)

( * ) Notice: This patent issued on a continued prosecution application filed under 37 CFR 1.53(d), and is subject to the twenty year patent term provisions of 35 U.S.C. 154(a)(2).

Under 35 U.S.C. 154(b), the term of this patent shall be extended for 0 days.

This patent is subject to a terminal disclaimer.

(21) Appl. No.: 08/961,541

(22) Filed: Oct. 30, 1997

Related U.S. Application Data

(63) Continuation of application No. 08/478,994, filed on Jun. 7, 1995, now Pat. No. 5,720,813.

(51) Int. Cl.[7] .................................................. B05C 5/02
(52) U.S. Cl. ........................ 118/314; 118/316; 118/325; 134/64 R
(58) Field of Search ........................ 118/313–316, 325, 118/300; 134/122 R, 64 R, 64 P, 122 P; 354/300, 325; 198/624; 226/8 B

(56) References Cited

U.S. PATENT DOCUMENTS

Re. 29,784    9/1978   Chadwick et al. .
T893,001     12/1971   Fisler .

(List continued on next page.)

FOREIGN PATENT DOCUMENTS 1935707      2/1970   (DE) .
26 06 984    8/1978   (DE) .

(List continued on next page.)

OTHER PUBLICATIONS

Schering Brochure (35 pgs.), undated.
"Machining—Flood Bar & Skid", Advanced Systems Incorporated Drawing No. 550324 dated Jul. 20, 1981.

(List continued on next page.)

*Primary Examiner*—Laura Edwards
(74) *Attorney, Agent, or Firm*—Akin, Gump, Strauss, Hauer & Feld, L.L.P.

(57) ABSTRACT

Apparatus for advancing and processing a flexible panel in a feed path includes a platen located proximate the feed path, the platen defining a platen surface extending in close proximity parallel to the feed path, a linear array of closely spaced fluid ports formed in the platen for receiving a pressurized fluid and directing the fluid toward the feed path in a transversely elongated fluid path, a transversely elongate chamber fixedly connected to the platen for defining a fluid chamber, the fluid ports being fluid-connected to the chamber; first, second, third and fourth roller shafts rotatably supported transversely to the feed path and having a spaced plurality of rollers thereon for contacting the panel, the first and third roller shafts contacting the panel upstream of the fluid port, the second and fourth roller shafts contacting the panel downstream of the fluid port, the rollers of the third and fourth roller shaft being located in offset overlapping relation to the rollers of the first and second roller shafts, respectively, the roller shafts being driven for advancing the panel proximate the platen, the platen having first wing portions extending between adjacent rollers of the first roller shaft for stripping the panel from the rollers of the first roller shaft, and second wing portions extending between adjacent rollers of the second roller shaft for facilitating passage of the sheet member onto the rollers of the second roller shaft, the fluid making area contact and supporting the panel in closely spaced relation to the platen.

10 Claims, 4 Drawing Sheets

U.S. PATENT DOCUMENTS

| | | |
|---|---|---|
| 1,375,663 | 4/1921 | Ainsworth . |
| 2,042,030 | 5/1936 | Tainton . |
| 3,022,203 | 2/1962 | Mains et al. . |
| 3,082,774 | 3/1963 | Benton et al. . |
| 3,354,543 | 11/1967 | Lawrence et al. . |
| 3,409,524 | 11/1968 | Olson . |
| 3,421,211 | 1/1969 | Eaves et al. . |
| 3,483,616 | 12/1969 | Shomphe . |
| 3,734,109 | 5/1973 | Hebner . |
| 3,806,393 | 4/1974 | Haas . |
| 3,849,831 | 11/1974 | DeVerter et al. . |
| 3,868,272 | 2/1975 | Tardoskegyi . |
| 3,873,429 | 3/1975 | Brown . |
| 3,905,827 | 9/1975 | Goffredo et al. . |
| 3,933,544 | 1/1976 | Haas . |
| 3,935,041 | 1/1976 | Goffredo et al. . |
| 4,017,343 | 4/1977 | Haas . |
| 4,058,431 | 11/1977 | Haas . |
| 4,060,230 | 11/1977 | Church et al. . |
| 4,076,222 | 2/1978 | Schaming . |
| 4,077,865 | 3/1978 | Müller . |
| 4,131,483 | 12/1978 | Iwahashi et al. . |
| 4,132,567 | 1/1979 | Blackwood . |
| 4,137,988 | 2/1979 | Croix-Marie . |
| 4,174,261 | 11/1979 | Pellegrino . |
| 4,202,073 | 5/1980 | Hughes . |
| 4,267,024 | 5/1981 | Weiskopf . |
| 4,270,317 | 6/1981 | Kurie . |
| 4,305,765 | 12/1981 | Wilmotte et al. . |
| 4,327,756 | 5/1982 | Rath . |
| 4,329,188 | 5/1982 | Wang . |
| 4,402,799 | 9/1983 | Ash et al. . |
| 4,402,800 | 9/1983 | Ash et al. . |
| 4,425,869 | 1/1984 | Hull . |
| 4,458,703 | 7/1984 | Inoue et al. . |
| 4,466,864 | 8/1984 | Bacon et al. . |
| 4,495,024 | 1/1985 | Bok . |
| 4,519,846 | 5/1985 | Aigo . |
| 4,543,130 | 9/1985 | Shwartzman . |
| 4,544,395 | 10/1985 | Evans . |
| 4,557,785 | 12/1985 | Ohkuma . |
| 4,576,685 | 3/1986 | Goffredo et al. . |
| 4,589,926 | 5/1986 | Holmstrand . |
| 4,594,748 | 6/1986 | Warfvinge . |
| 4,622,917 | 11/1986 | Schramm . |
| 4,741,798 | 5/1988 | Haas . |
| 4,772,365 | 9/1988 | Haas . |
| 4,781,205 | 11/1988 | Shakley . |
| 4,789,405 | 12/1988 | Blasing et al. . |
| 4,806,192 | 2/1989 | Haas . |
| 4,852,595 | 8/1989 | Baier et al. . |
| 4,852,804 | 8/1989 | Baier et al. . |
| 4,854,004 | 8/1989 | Omata et al. . |
| 4,999,079 | 3/1991 | Ash . |
| 5,032,204 | 7/1991 | Haas . |
| 5,035,765 | 7/1991 | Haas . |
| 5,038,706 | 8/1991 | Morris . |
| 5,063,951 | 11/1991 | Bard et al. . |
| 5,076,885 | 12/1991 | Haas et al. . |
| 5,118,357 | 6/1992 | Sabatka . |
| 5,154,772 | 10/1992 | Kallfass . |
| 5,176,158 | 1/1993 | Ketelhohn et al. . |
| 5,191,908 | 3/1993 | Hiroe et al. . |
| 5,192,394 | 3/1993 | Bard et al. . |
| 5,209,180 | 5/1993 | Shoda et al. . |
| 5,209,782 | 5/1993 | Morris . |
| 5,282,485 | 2/1994 | Hirai et al. . |
| 5,289,639 | 3/1994 | Bard et al. . |
| 5,292,424 | 3/1994 | Blasing et al. . |
| 5,294,259 | 3/1994 | Canestaro et al. . |
| 5,297,568 | 3/1994 | Schmid . |
| 5,326,442 | 7/1994 | Schmid . |
| 5,335,681 | 8/1994 | Schmid . |
| 5,378,307 | 1/1995 | Bard et al. . |
| 5,391,276 | 2/1995 | Astor et al. . |
| 5,494,529 | 2/1996 | Ciccarelli et al. . |
| 5,529,081 | 6/1996 | Kappler . |
| 5,553,633 | 9/1996 | Ciccarelli, Jr. et al. . |
| 5,553,700 | 9/1996 | Smith et al. . |
| 5,558,757 | 9/1996 | Hübel . |
| 5,614,264 | 3/1997 | Himes . |
| 5,720,813 | * 2/1998 | McDonald ........................ 118/314 |
| 5,746,234 | 5/1998 | Jones . |

FOREIGN PATENT DOCUMENTS

| | | |
|---|---|---|
| 30 11 061 A1 | 10/1981 | (DE) . |
| 33 05 564 C1 | 3/1984 | (DE) . |
| 30 01 726 C2 | 8/1984 | (DE) . |
| 35 28 575 A1 | 2/1987 | (DE) . |
| 0 037 483 | 10/1981 | (EP) . |
| 0 078 900 | 5/1983 | (EP) . |
| 2 301 307 | 9/1976 | (FR) . |
| 2 606 984 | 5/1988 | (FR) . |
| 1 456 729 | 11/1976 | (GB) . |
| 2 197 581 | 5/1988 | (GB) . |
| 54-36056 | 3/1979 | (JP) . |
| 59-118621 | 7/1984 | (JP) . |
| 62-136428 | 6/1987 | (JP) . |
| 63-108676 | 7/1988 | (JP) . |
| 63-41092 | 10/1988 | (JP) . |
| 40-4313543 | 11/1992 | (JP) . |
| 40-4313544 | 11/1992 | (JP) . |

OTHER PUBLICATIONS

"Mechanical Stripper", *IBM Technical Disclosure Bulletin*, vol. 16, No. 9, Feb. 1974, p. 2953.

"Mechanical Stripper With Drum Stop", *IBM Technical Disclosure Bulletin*, vol. 19, No. 5, Oct. 1976, pp. 1595 and 1596.

Article entitled "Mass Transfer from an Oblique Impinging Slot Jet", admitted prior art.

Article entitled "Physik", 1969.

Publication entitled "Proceedings of the Printed Circuit World Convention II", admitted prior art.

Article entitled "Bohrlochreinigung durch Ätzen (Smear–Removal–Verfahren)", 1986.

Schering brochure, 1983, entitled "Moderne Aspekte zur Lochwandreinigung mit permanganathaltigen Losungen".

Article entitled "Kleine Löcher kein", 1987.

Letterplatten–Seminar 1981.

IBM Tehnical Bulletin entitled "Ultrasonic Chemical Method of Cleaning Blind Holes in a Printed–Circuit Board", 1977.

Article entitled Maschinelle chemische Lochwandreinigung im Durchlaufverfahren, 1983.

* cited by examiner

THIN SHEET HANDLING SYSTEM CROSS-REFERENCE TO RELATED APPLICATIONS

CROSS-REFERENCE TO RELATED APPLICATIONS

This application is a continuation of U.S. application Ser. No. 08/478,994, filed Jun. 7, 1995, now U.S. Pat. No. 5,720,813.

BACKGROUND

The present invention relates to equipment for handling, processing and cleaning thin panels, including highly flexible sheet members.

In the art of conveyorized fluidic processing of extremely thin articles, such as flexible electronic circuits, it is desirable not only to have a machine that both transports the thin articles from conveyor roller to conveyor roller with minimal damage and delivers fluid efficiently and effectively to its surface(s), but also to have such a machine whose parts are easily disassembled for maintenance purposes. This fluidic processing includes, among others, circuit feature etching, photo resist image developing, surface treatments and depositions, rinsing and drying.

When the fluid process incorporates delivering the fluid in streams as a sprayed liquid or ducted air over and/or under a conveyorized roller system with the axes of the rollers transverse the direction of desired article travel, it is necessary to mechanically support the thin articles from below and also often from above while attempting to minimize the interference such support tends to impart on the fluid streams. Without sufficient mechanical support, thin articles tend to buckle, wrinkle and/or jam in the conveyor system, causing unwanted machine downtime and loss of product. Towards such minimized interference, narrow rods with wheels are used for mechanical support, rather than solid cylindrical rollers, the spaces between the wheels being intended to allow for more free travel of the sprayed liquid to reach the surface of the article. Often an opposing set of upper rods and wheels are used to keep the articles from lifting and/or buckling.

To minimize downtime during maintenance, both rollers and wheeled rods along with fluid delivery devices, have been designed so as to be able to be disengaged and removed easily and individually from the conveyor system. However, in the case of systems for thin articles, to effectively "hand-off" the article from roller to roller so that gravity or the force of the impinging fluid does not cause the thin article to lift or dive between rollers, multiple clip-on guides which attach to conveyor rods or wires are used for mechanical support. The surface of these guides or wires which are nearest to the desired path of article travel approximately form (a) plane(s) above or below the article, above (between) which the article is directed to travel. A disadvantage of such guides or wires is that they tend to interfere with the spray streams, however, and detract from uniformity of processing. Another disadvantage is that such guides or wires need to be individually removed before free access to the wheeled rods can be obtained, such removal being exceptionally tedious where many guides or wires are used. A design that overcomes this impediment to speedy maintenance removal of wheeled rods is to have the wheels of a larger diameter than the center spacing between adjacent rods, or in other words, overlapping wheels. These wheels are effective at guiding the articles and allow for easy removal and installation for maintenance purposes, but still interfere with the delivery of fluid to the article surface.

Thus there is a need for apparatus that overcomes the disadvantages of the prior art.

SUMMARY

The present invention meets this need by providing an apparatus having a plenum for delivering fluid through one or more orifices or a sieve that is aligned transverse to an article transport path. Wings extend upstream and/or downstream of the plenum and integrate with wheeled rod(s) immediately adjacent thereto. In one aspect of the invention, the apparatus includes a platen member located proximate the feed path, parallel thereto; at least one fluid port formed in the platen member for receiving a pressurized fluid and directing the fluid toward the feed path in a transversely elongated ejecting strip of fluid; a first roller shaft rotatably supported transversely to the feed path and having a spaced plurality of rollers thereon for contacting the panel upstream of the fluid port; a second roller shaft rotatably supported transversely to the feed path and having one or more rollers thereon for contacting the panel downstream of the fluid port; means for driving the first and second roller shafts for advancing the panel proximate the platen member; and the platen member having first wing portions extending between adjacent rollers of the first roller shaft for stripping the panel from the rollers of the first roller shaft, the ejecting strip of fluid making unimpeded contact along the full transverse width of the panel as the panel is advanced.

The platen member can define a main platen surface extending in close proximity to the feed path, end extremities of the first wing portions defining spaced segments of a first transition surface that extends between the rollers of the first roller shaft not closer to the feed path than the nip of the rollers of the first roller shaft, the first transition surface smoothly joining the main platen surface for facilitating passage of the sheet member over the platen member. The platen member can further include second wing portions extending between adjacent rollers of the second roller shaft. End extremities of the second wing portions can define spaced segments of a second transition surface that extends between the rollers of the second roller shaft not closer to the feed path than the nip of the rollers of the second roller shaft for facilitating passage of the sheet member onto the rollers of the second roller shaft. The main platen surface can be substantially planar and horizontal.

An exit extremity of the fluid port can be elongated in a direction transverse to the feed path. Preferably the apparatus has a linear array of closely spaced fluid ports for producing the elongated ejecting strip of fluid. The apparatus can further include a transversely elongate chamber member fixedly connected to the platen member for defining a fluid chamber, the fluid ports being fluid-connected to the chamber. The chamber member can be integrally formed with the platen member. The apparatus can further include a pair of releasable mounts, each of the releasable mounts being fixably connected proximate a respective end extremity of the chamber member for releasably supporting the platen member and the chamber member relative to the feed path. The fluid ports can extend substantially a full width of the feed path.

The apparatus can further include a third roller shaft rotatably supported transversely to the feed path and rotationally coupled to the means for driving, the third roller shaft having a spaced plurality of rollers thereon for contacting the panel upstream of the rollers of the first roller shaft, the rollers of the third roller shaft being located in offset overlapping relation to the rollers of the first roller shaft. The apparatus can further include a fourth roller shaft rotatably supported transversely to the feed path and rotationally coupled to the means for driving, the fourth roller shaft having a spaced plurality of rollers thereon for contacting the panel downstream of the rollers of the second roller shaft, the rollers of the fourth roller shaft being located in offset overlapping relation to the rollers of the second roller shaft.

The means for driving can include a powered drive shaft rotatably supported and oriented parallel to the feed path, the drive shaft being coupled in geared relation to each of the roller shafts. The apparatus can further include at least one auxiliary roller shaft rotatably supported transverse to the feed path and having a plurality of rollers thereon for contacting the panel on a side thereof opposite the first and second roller shafts.

In another aspect of the invention, an apparatus for guiding and processing a flexible panel in a feed path in association with a first and second roller shafts, each roller shaft having a spaced plurality of rollers thereon for contacting and advancing the panel, includes the platen member defining a main platen surface; means for supporting the platen member with the main platen surface proximate the feed path at a location intermediate the first and second roller shafts; the at least one fluid port formed in the platen member; and the platen member having the first wing portions.

The present invention allows for continuous conveyorized processing of thin, discrete articles, is easily removed for maintenance purposes, and delivers fluid directly to the article surface with flow that is unimpeded over a continuous line transverse to the direction of article travel. The device slips easily in and out of the conveyor as one complete unit, simplifying removal for maintenance purposes.

DRAWINGS

These and other features, aspects, and advantages of the present invention will become better understood with reference to the following description, appended claims, and accompanying drawings, where:

DESCRIPTION

Figure 1:
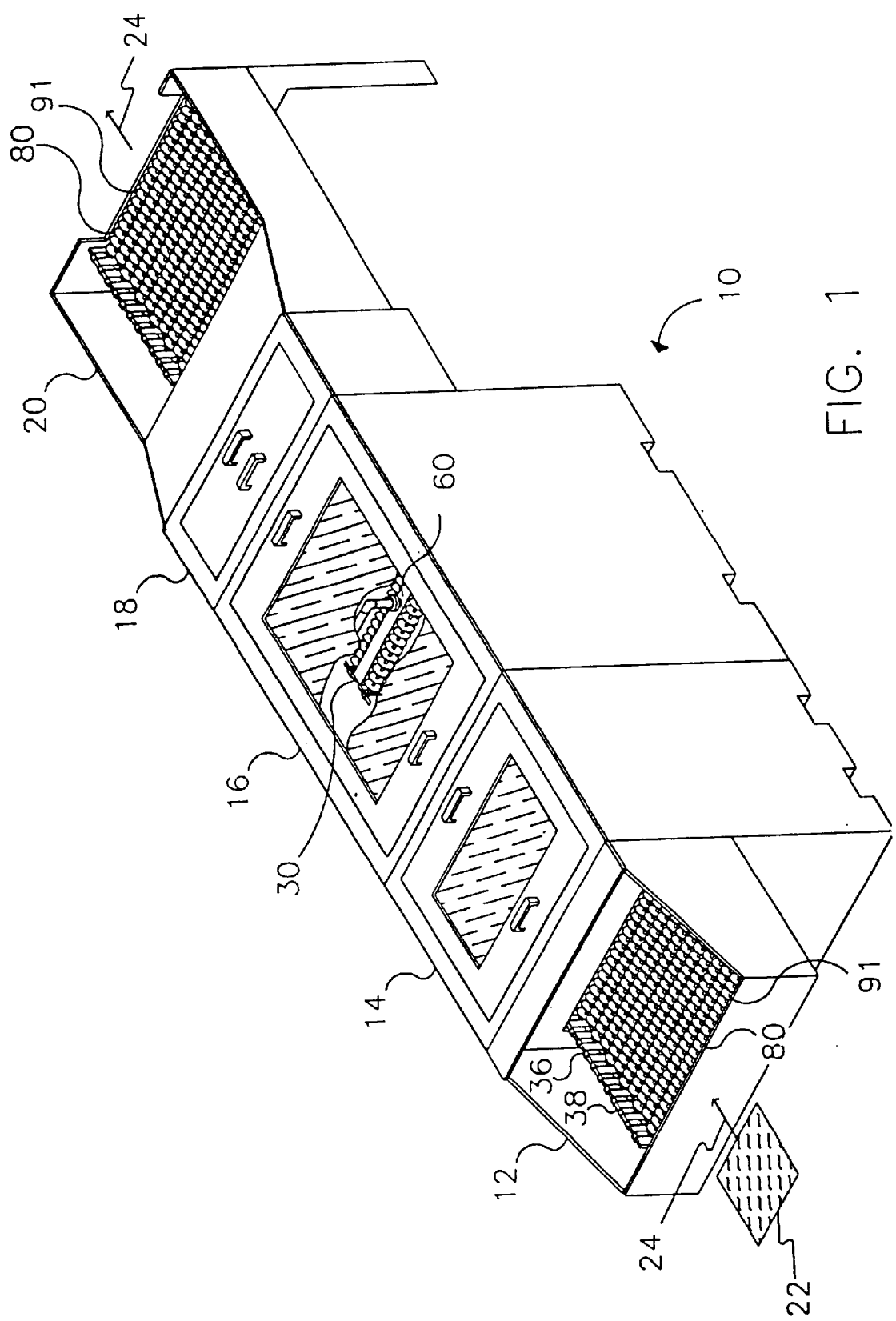
FIG. 1 is a generalized depiction of a conveyorized processing machine incorporating apparatus according to the present invention for delivering one or more fluids to a flexible panel as it travels along a predetermined feed path.

The present invention is directed to apparatus that is particularly useful for advancing, guiding, and processing highly flexible sheet members. With reference to FIGS. 1–4 of the drawings, FIG. 1 depicts a general representation of a conveyorized processing machine 10, with an input module 12, a first processing module 14, a second processing module 16, a drying module 18 and an output module 20. A flexible panel 22 is transported along a feed path 24 on a conveyor 91. Each of the modules 12 through 20 serve to transport the flexible panel 22, while the modules 14 through 18 additionally deliver at least one processing fluid (liquid or gaseous) to at least one surface of the flexible panel 22, and are separable from each other for addition or subtraction of processes to the machine 10. The processing fluids which are applied can include, but are not limited to, processes such as photo resist developing, etching, through-hole treatment, plating, rinsing, surface treatment, anti-tarnish, drying and the like.

The flexible panel 22 can be a flexible circuit member, such as plated and/or etched copper lines on polyamide, epoxy-glass laminate or kapton, but might also be other thin, flexible articles which are to be processed, such as shadow masks, photographic films, thin glass sheets, or etc. Fluid delivery is achieved by the means of pumps, blowers, and the like (not shown), and in the case of liquid process fluids, is usually recirculated from a tank or sump within each module. The materials of construction for each of the modules in the machine 10 are compatible with their respective processing fluids and can include for example, polyvinyl chloride (PVC), chloro-polyvinyl chloride (CPVC), titanium, stainless steel, kynar, polypropylene, polycarbonate (Lexan) and/or tempered glass.

Figure 2:
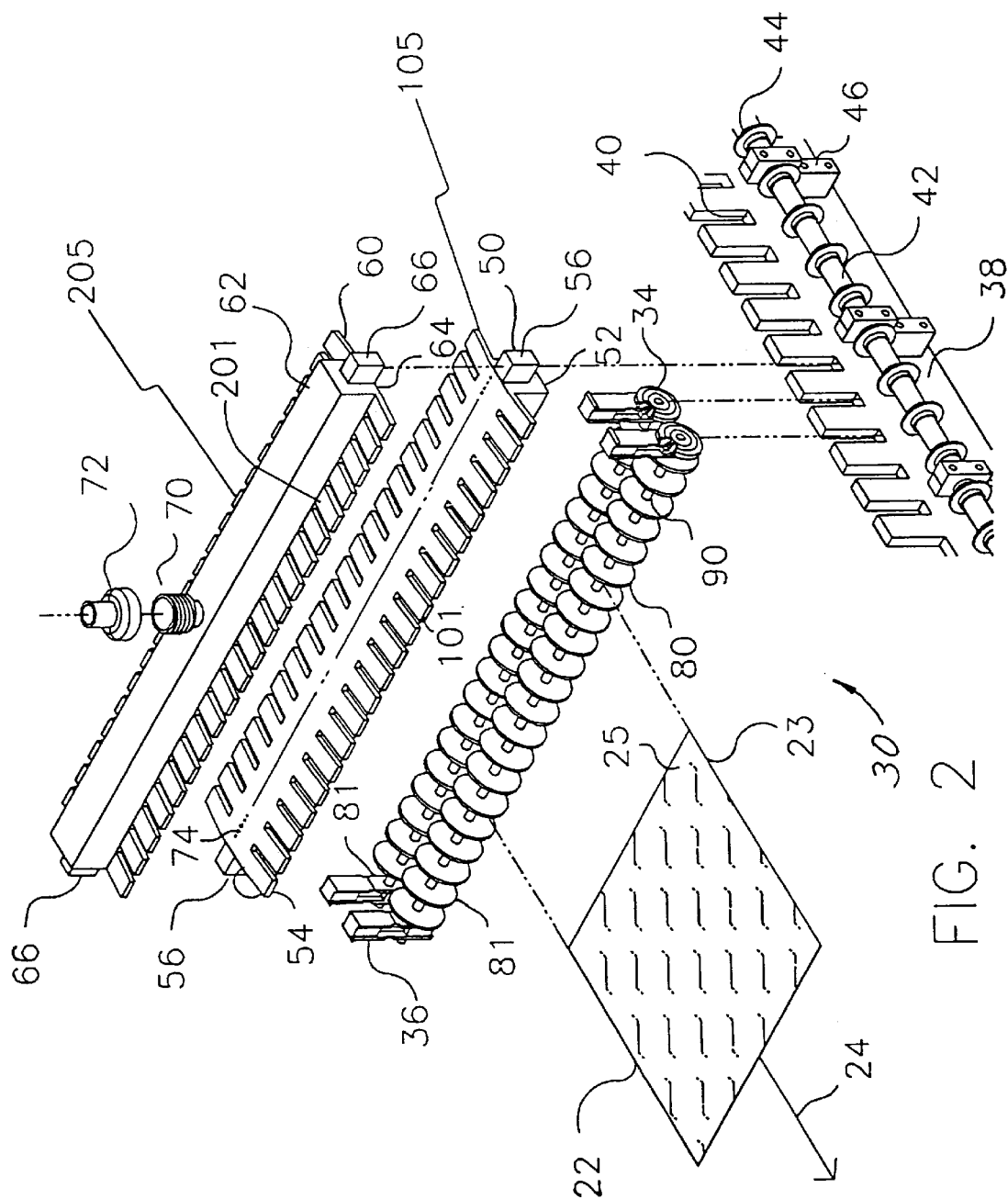
FIG. 2 is an exploded view of the apparatus and a portion of the machine in FIG. 1.

According to the present invention, the machine 10 is provided with one or more processing apparatus 30, one such apparatus 30 being located in the second processing module 16. It is contemplated that counterparts of the apparatus 30 may be utilized in the first processing module 14 and the drying module 18. With particular reference to FIG. 2, the apparatus 30 is shown in relation to the conveyor 91 internal to a fluid process module in the processing machine 10, looking from the back side of the view shown in FIG. 1. A pair of conveyor rails 38 for the preferred embodiment provide rotational support for both a drive shaft 42 (supported by one of the rails 38 only, by means of a plurality of drive shaft bearing blocks 46), and also for a plurality of lower roller shafts 90 (by means of a plurality of roller shaft bearing blocks 36). One or more drive motors (not shown) rotate(s) the drive shaft 42 and a plurality of drive shaft gears 44 extending along the drive shaft 42, which engagingly turn a plurality of roller shaft gears 34, the lower roller shafts 90 each with a plurality of lower rollers 80, which engage the flexible panel 22 for transport along the feed path 24. In the preferred embodiment, the rails 38 are machined from ½" thick PVC, CPVC or polypropylene plastic.

A lower fluid delivery device 50 with an integral fluid chamber 52, an integral lower platen member 54 having a platen surface 55, and a pair of lower mounting blocks 56 (on both ends). The platen member 54 has a plurality of fluid ports 74 formed therein for directing pressurized fluid to at least a lower surface 23 of the flexible panel 22. In the preferred embodiment, these fluid ports are a row of drilled holes about 0.063 in. in diameter which are substantially normal to the surface 55 of the lower platen member 54 and spaced on 0.250 in. centers in a line transverse to the feed path 24. Other embodiments can be envisioned, such as a single, continuous elongated slot, a series of slanted slots, or arrays of ports of any of a number of shapes, and/or ports drilled at angles varying from normal to nearly tangential to the surface 55 of the platen member 54, without departing from the intent of the present invention, which is to provide at least one surface of the flexible panel 22 with processing fluid across an elongate area, which elongate area is to be simultaneously unimpeded with any substantial mechanical fluid flow blockage between the surface 55 of the platen member 54 and the flexible panel surface 23, this unimpeded region being continuous in a strip across the transverse width of the flexible panel 22. Although this preferred embodiment delivers processing fluid in jets which impinge on the surface of the panel 22, the fluid may be applied relatively quiescently for processes sensitive to high flow rates as well. Additionally, the aforementioned conveyor 91 and the lower fluid delivery device 50 may transport and process the panel 22 in a vertical, rather than horizontal, configuration.

An optional upper fluid delivery device 60 with an integral upper fluid chamber 62, an upper platen member 64 (having a platen surface 65) and upper mounting blocks 66 has counterparts of the fluid ports 74 (hidden from view in FIG. 2) for directing pressurized fluid to at least an upper surface 25 of the flexible panel 22. Both of the fluid delivery devices 50 and 60 have at least one inlet 70 (shown only for the upper device 60) attached by a plumbing union 72 for receiving processing fluid from the aforementioned pumps or blowers. The fluid ports 74, the union 72, and the inlet 70 are not necessarily identical for the devices 50 and 60, nor are the ports 74 necessarily identical within the devices 50 or 60.

The conveyor 91 consists of a plurality of roller assemblies 81 which each consist of one of the roller shafts 90, two of the roller shaft bearing blocks 36, one of the roller shaft gears 34, and one or more of the lower rollers 80. The preferred embodiment optionally allows for an upper roller shaft 190 (each with a plurality of upper rollers 180) which can slide into grooves (not shown) in the roller shaft bearing blocks 36, in order to maintain the flexible panel 22 within the desired feed path. The upper roller shafts 190 and their rollers 180 can slide freely up and down in the grooves in the roller bearing blocks 36 during operation and for removal, and each assembly 81 can be removed as a unit. Also in the preferred embodiment, the lower rollers 80 are 2.25 inches in diameter and approximately ⅛ in. thick, and the roller assemblies 81 are spaced on a two-inch longitudinal pitch along the conveyor 91. Alternatively, the lower rollers 80 can be much thicker, and can comprise a substantial portion of the width of the conveyor. As will be further discussed with FIGS. 3 and 4, such an arrangement of pitch distance being less than roller diameter allows for overlapping of the rollers 80 along the feed path 24.

Materials of construction for the rollers 80 and 180 can include EPDM, polypropylene, or other material which is resistant to decomposition under the desired operating conditions. The preferred embodiment also includes perforations (not shown) within each of the rollers 80 and 180 to allow lighter weight and/or to minimize the blockage of fluid flow in a transverse direction. The roller shafts 90 and 190 for the preferred embodiment are constructed of epoxy-coated 0.375 inch diameter fiberglass rods, and the bearing blocks 36 and 46, along with the gears 34 and 44, are molded polypropylene. For most uses of the fluid delivery devices 50 and 60, a preferred material is extruded PVC. The fluid delivery device 50 is extruded in one piece along with a lower forward wing portion 100 and a lower rearward wing portion 104 (both attached to the lower device 50). Similarly, the fluid delivery device 60 is extruded in one piece along with an upper forward wing portion 200 and an upper rearward wing portion 204 (both attached to the upper device 60), which wing portions 100, 104, 200 and 204 are then subsequently machined to create a plurality on each wing of spaced segments 101, 105, 201 and 205, respectively. Dispersion plates (not shown) may be included within the chambers 52 and/or 62 to help uniformly distribute the fluid pressure among the fluid ports 74. End plugs which include the respective mounting blocks 56 and 66 are glued in to seal the ends of fluid chambers 52 and 62, respectively. In the preferred embodiment, the fluid chambers 52 and 62 are approximately 1⅝ in. wide by 1⅞ in. tall, with the winged portions 100, 104, 200 and 204 extending approximately 2 in. out from the sides of fluid chambers 52 or 62. The thickness of the winged portions 100, 104, 200 and 204 and of the walls of the fluid chambers 52 and 62 is approximately 0.25 in. The spaced segments 101, 105, 201 and 205 are all approximately of equal rectangular dimensions (though not necessarily so) and are about 1.625 (in the direction parallel to feed path 24) in. by 0.875 in. (in the transverse direction) with spaces between them (in the transverse direction) of about 0.375 in. It is noted here that other dimensions and spacings may be used, the main purpose being to support the flexible panel 22 sufficiently while not interfering with the rotation of the rollers 80 or 180.

With further reference to FIG. 2, access to areas above or below the conveyor 91 for maintenance purposes is facilitated by sliding the roller assemblies 81 out of one of a plurality of conveyor rail slots 40 in the conveyor rails 38. Similarly, one or both of the fluid delivery devices 50 and 60 may be removed by sliding the respective mounting blocks 56 and 66 out of the conveyor rail slots 40 and by undoing the plumbing unions 72. This aspect of simple removal of the fluid delivery devices 50 and/or 60 is one of the useful advantages of the inventive apparatus, while still maintaining support of the flexible panels 22 as they are being transported during operation, as further described below. Although just one configuration of simple, independent removal of the fluid delivery devices 50 and 60 has been disclosed in detail, other configurations can be used (such as using flexible hoses with hose clamps in place of rigid plumbing with the plumbing unions 72 or releasable clamps and brackets in place of slidable roller shaft bearing blocks 36) to allow for the desired removability, and need not be exhaustively described.

Figure 3:
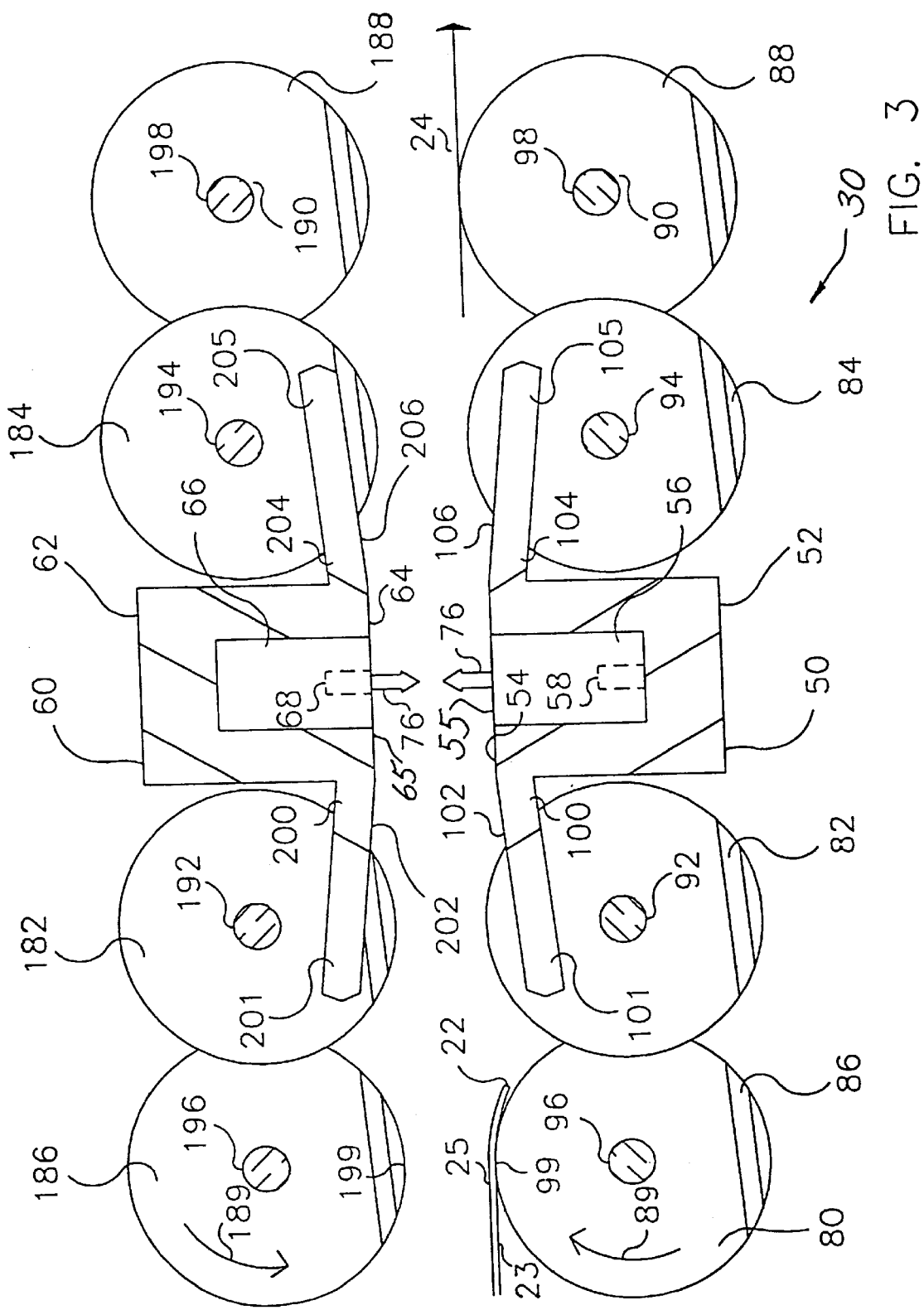
FIG. 3 is a cross-sectional front view of the apparatus of FIG. 1.
Figure 4:
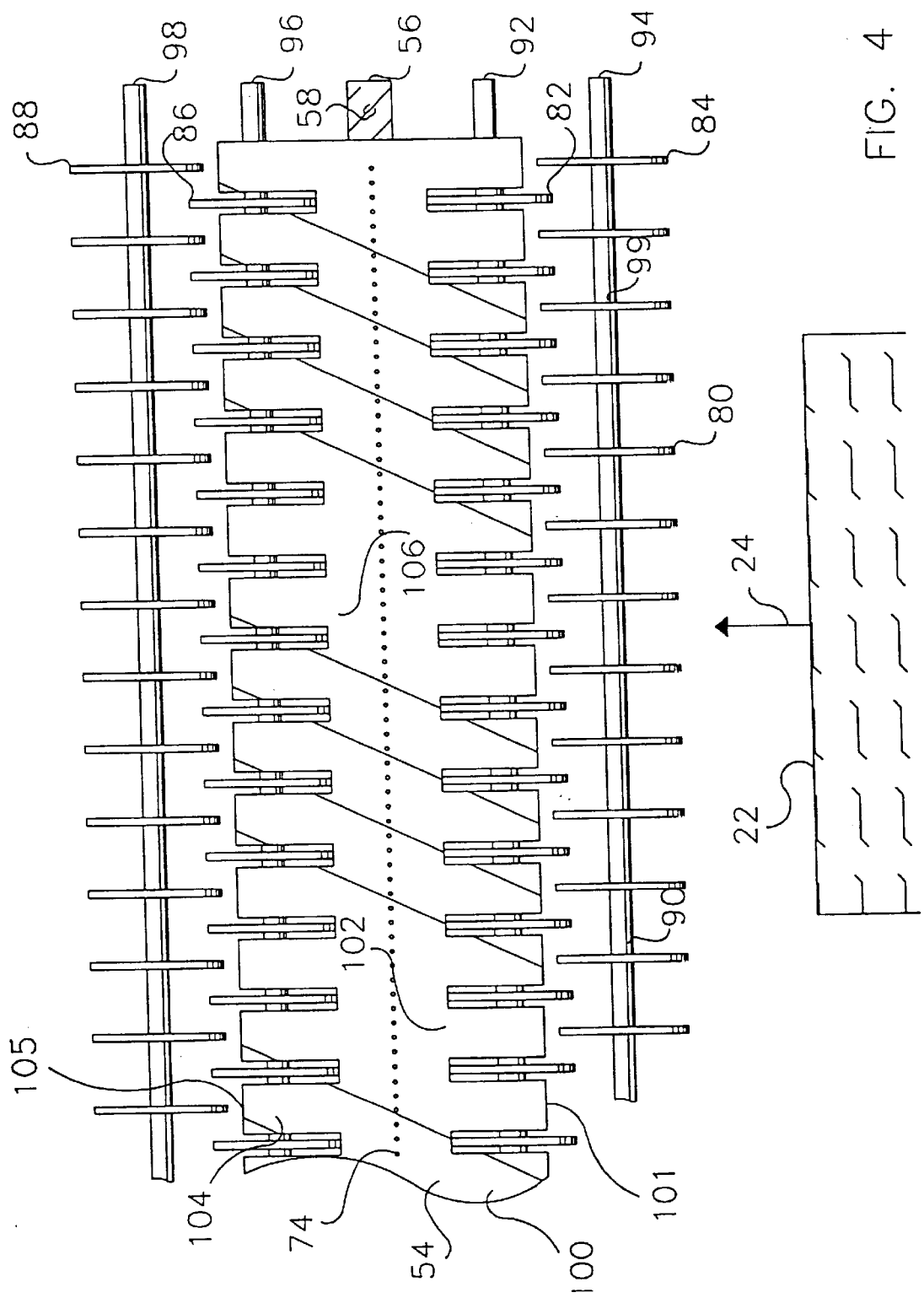
FIG. 4 is a top view of a lower portion of the apparatus of FIG. 1.

With reference to FIGS. 3 and 4, the working relationship of the rollers 80 and 180 and the fluid delivery devices 50 and 60 can be seen. The rollers 80 as they relate to the fluid devices 50 consist of a first lower roller set 82 immediately forward of the lower device 50, a second lower roller set 84 immediately to the rear of the lower device 50, a third lower roller set 86 forward of the first lower roller set 82, and a fourth lower roller set 88 immediately to the rear of the second lower roller set 84. Immediately above the lower sets 82, 84, 86 and 88 are a first upper roller set 182, a second upper roller set 184, a third upper roller set 186, and a fourth upper roller set 188, respectively. Corresponding to roller sets 82 through 88 and 182 through 188 are first through fourth lower roller shafts 92, 94, 96 and 98 and first through fourth upper roller shafts 192, 194, 196 and 198, respectively. The lower roller sets 82 through 88 are all driven in a clockwise direction as indicated by a lower direction arrow 89, by means of the respective roller shafts 92–98, which are all engaged with the drive shaft 42 in the manner described for FIG. 2. Likewise, the upper roller sets 182 through 188 are all rotated in a counter clockwise direction as indicated by a upper direction arrow 189. Note that in FIG. 3 the upper rollers 180 and the upper roller shafts 190 are depicted (for ease of numbering) at an exaggerated vertical spacing from the lower rollers, while in actual operation the upper rollers 180 will actually contact the corresponding lower rollers 80 when there is no panel between them. The upper rollers 180 are idler rollers, and are driven in a counterclockwise direction by the rotation of the lower rollers 80 and/or the passage of the flexible panel 22 beneath them. One or more of the upper roller shafts 190 and upper rollers 180 may optionally be driven as well.

In operation, as the flexible panel 22 travels across the rollers 80 past respective roller nips 99 and corresponding nips 199 on the rollers 180. As used herein "nip" refers to a tangential point on a roller nearest the intended feed path 24. Regarding the rollers 180 of the upper fluid delivery device 60, both gravity and fluid flow would tend to combine to pull the leading edge of flexible panel 22 downward away from the intended feed path 24, which ultimately could lead to the panel straying from the feed path 24 and/or jamming in the conveyor 91 or surrounding apparatuses, both of which would lend to undesirable loss of production time, materials and/or labor. To avoid this difficulty, the present invention provides that after the flexible panel 22 has passed the nip 99 of the first lower roller set 82, the extremities of the forward wing portion 100 and the surface 55 of the platen member 54 extends out from the fluid chamber 52 and divides into the segments 101 which overlap into the spaces between the rollers 82 and which provide a lower transition surface 102, elevated slightly below the nip 99 of the lower set 82, for guiding and/or supporting the flexible panel 22 so that it travels across lower platen member 54 and is brought in contact with a transversely elongate ejecting strip of fluid 76.

The vertical position of the fluid delivery devices 50 and 60 relative to the feed path 24 can be adjusted by using set screws (not shown) in a lower set-screw hole 58 and an upper set-screw hole 68, and is preferably set so that the surfaces 55 and 65 of the platens 54 and 64 are 0.150 in. further from feed path 24 than the nips 99 and 199 of the rollers 80 and 180, respectively. The set screws for the lower device 50 adjust height off of the bottom of the rail slots 40 (see FIG. 2), and the set-screws for upper device 60 adjusts height off of the top of the lower mounting block 56. Note that use of these set screws allows for adjustability while not interfering with the relatively easy removal of the devices 50 and 60 from the conveyor rails 38. In the preferred embodiment, the set screws are #1/4–20 by 1 in. long and are made of either stainless steel or titanium metal.

As the flexible panel 22 passes proximate the ejecting strip of fluid 76, the strip of fluid may additionally provide a fluid bearing between the lower surface 23 of flexible panel 22 and the upper surface 55 of the platen member 54, significantly reducing the friction therebetween and further easing its transport. In this way, both the objectives of maintaining the desired transport direction of the panel and of delivering processing fluid to at least the lower surface 23 in the transverse elongate area in the vicinity of the ejecting strip of fluid 76 without mechanical impediments to flow, are achieved.

Similarly for FIGS. 3 and 4, on the downstream side of the lower fluid delivery device 50, the lower rearward wing portion 102 can also be extended outwards from the fluid chamber 52 and can be divided into the lower rearward segments 105 which overlap into the spaces between the rollers 80 of the second lower roller set 84. This aids in smoothly guiding flexible panel 22 onto second lower roller set 84. Likewise, although not shown in FIG. 4, the optional upper fluid delivery device 60 can be used with the upper forward and rearward wing portions 200 and 204 with the upper segments 201 and 205 that overlap the spaces between upper rollers 180 of upper roller sets 182 and 184, respectively. These upper forward and rearward wing portions 200 and 204 provide transition surfaces 202 and 206 for preventing flexible panel 22 from diverting upward away from the intended feed path 24 due to either surface tension effects or fluid flow or pressures.

Also depicted in FIGS. 3 and 4 is the overlapping between adjacent lower roller sets 82 and 86 as well as the sets 84 and 88. Without such overlap, the flexible panel 22 might tend to fall between these roller pairs and would become diverted away from being adequately or completely processed along the feed path 24, or would become jammed in the conveyor 91, either of which can detract from processing yields and/or quality. Similarly, the preferred embodiment optionally includes overlapping between pairs of upper roller sets 182 and 186 and between sets 184 and 188.

Although the present invention has been described in considerable detail with reference to certain preferred versions thereof, other versions are possible. Therefore, the spirit and scope of the appended claims should not necessarily be limited to the description of the preferred versions contained herein.

What is claimed is:

1. An apparatus for advancing and processing a flexible panel conveyed along a feed path, comprising:
   a support member located proximate the feed path, generally parallel thereto;
   at least one fluid delivery device positioned on the support member and having a planar surface and at least one fluid port located proximate to the planar surface for receiving a pressurized fluid and directing the fluid toward the feed path along a predetermined path;
   a first spaced plurality of rollers rotatably supported upstream of the at least one fluid port a portion of an outer surface of the first spaced plurality of rollers being coincident with the feed path and defining a surface generally aligned with the planar surface of the at least one fluid delivery device;
   first wing portions extending from the support member between at least two adjacent rollers of the first spaced plurality of rollers, the wing portions extending generally downwardly away from the predetermined path, the wing portions being adapted to support the flexible panel as it advances toward the at least one fluid port and being spaced from the predetermined path such that the fluid directed toward the feed path directly impacts upon the flexible panel.

2. The apparatus of claim 1 further comprising a drive shaft connected to the first plurality of rollers which is driven to advance the panel.

3. The apparatus of claim 1 further comprising a second spaced plurality of rollers rotatably supported downstream of the at least one fluid port; and
   second wing portions extending from the support member between at least two adjacent rollers of the second spaced plurality of rollers, the wing portions being adapted to support the flexible panel as it advances past the at least one fluid port.

4. The apparatus of claim 1 wherein the support member further comprises a pair of releasable mounts which support the support member in proximity to the feed path.

5. The apparatus of claim 1, further comprising a third spaced plurality of rollers rotatably supported adjacent to the feed path, the third spaced plurality of rollers being located in offset overlapping relation to the rollers of the first spaced plurality of rollers.

6. The apparatus of claim 5, further comprising a fourth spaced plurality of rollers rotatably supported adjacent to the feed path, the fourth spaced plurality of rollers being located in offset overlapping relation to the rollers of the second spaced plurality of rollers.

7. An apparatus for guiding and processing a flexible panel in a feed path in association with a spaced plurality of rollers for contacting and advancing the panels the apparatus comprising:
   a support member having a main surface located proximate the feed path, generally parallel thereto;

mounts that support the support member such that the main surface is proximate the feed path;

at least one fluid delivery device positioned on the support member and having a planar surface and at least one fluid port located proximate to the planar surface for receiving a pressurized fluid and directing the fluid toward the feed path along a predetermined path;

the spaced plurality of rollers having a portion of an outer surface coincident with the feed path and defining a surface generally aligned with the planar surface of the at least one fluid device; and first wing portions extending from the support member between at least two adjacent rollers of the first spaced plurality of rollers, the wing portions extending generally downwardly away from the predetermined path and below the planar surface of the support member to strip the panel from the rollers and being spaced from the predetermined path such that the fluid directed toward the feed path directly impacts upon the flexible panel.

8. The apparatus of claim 7 wherein end extremities of the first wing portions define spaced segments of a first transition surface, the first transition surface extending between the rollers of the first spaced plurality of rollers, the first transition surface smoothly joins the main surface of the support member to facilitate passage of the panel over the support member.

9. The apparatus of claim 7 further comprising a second spaced plurality of rollers rotatably supported downstream of the at least one fluid port; and second wing portions extending from the support member between at least two adjacent rollers of the second spaced plurality of rollers, the second wing portions extending below the main surface of the support member to feed the panel to the second spaced plurality of rollers.

10. The apparatus of claim 9 wherein end extremities of the second wing portions define spaced segments of a second transition surface, the second transition surface extending between the rollers of the second spaced plurality of rollers, the second transition surface smoothly joins the main surface of the support member to facilitate passage of the panel from the platen member to the second spaced plurality of rollers.

* * * * *